(12) United States Patent
Braendle

(10) Patent No.: US 6,395,379 B1
(45) Date of Patent: May 28, 2002

(54) WORKPIECE WITH WEAR-PROTECTIVE COATING

(75) Inventor: Hans Braendle, Sargans (CH)

(73) Assignee: Balzers Aktiengesellschaft, Furtentum (LI)

( * ) Notice: Subject to any disclaimer, the term of this patent is extended or adjusted under 35 U.S.C. 154(b) by 0 days.

(21) Appl. No.: 09/242,707

(22) PCT Filed: Sep. 3, 1997

(86) PCT No.: PCT/CH97/00321

§ 371 (c)(1),
(2), (4) Date: Apr. 22, 1999

(87) PCT Pub. No.: WO98/10120

PCT Pub. Date: Mar. 12, 1998

(30) Foreign Application Priority Data

Sep. 3, 1996 (JP) .............................................. 8/252384
Sep. 3, 1996 (JP) .............................................. 8/252385

(51) Int. Cl.⁷ .............................................. C23C 27/00
(52) U.S. Cl. ................. 428/216; 428/212; 428/336; 428/469; 428/472; 428/697; 428/698; 428/699; 51/307; 51/309
(58) Field of Search ................................. 428/216, 212, 428/336, 697, 698, 699, 469, 472; 204/192.12; 51/307, 309

(56) References Cited

U.S. PATENT DOCUMENTS

| | | | | |
|---|---|---|---|---|
| 4,554,201 A | * | 11/1985 | Andreev et al. ............ | 428/215 |
| 4,835,062 A | * | 5/1989 | Holleck ...................... | 428/469 |
| 5,330,853 A | * | 7/1994 | Hofmann et al. ........... | 428/699 |
| 5,350,599 A | | 9/1994 | Rigney et al. | |
| 5,652,045 A | * | 7/1997 | Nakamura et al. .......... | 428/698 |
| 5,679,448 A | * | 10/1997 | Kawata ....................... | 428/697 |
| 5,882,777 A | * | 3/1999 | Kukino et al. .............. | 428/216 |

FOREIGN PATENT DOCUMENTS

| EP | 0197185 | | 8/1985 |
|---|---|---|---|
| EP | 1040154 | | 9/1990 |
| EP | 0 446 375 | * | 9/1991 |
| EP | 0470644 | | 2/1992 |
| EP | 4127688 | | 12/1993 |
| EP | 4191735 | | 1/1994 |
| EP | 4191736 | | 1/1994 |
| EP | 4235265 | | 3/1994 |
| EP | 0592986 | | 4/1994 |
| EP | 4282556 | | 4/1994 |
| EP | 0685572 | | 12/1995 |
| EP | 0701982 | | 3/1996 |
| EP | 0709483 | | 5/1996 |
| EP | 0709484 | | 5/1996 |
| EP | 0736615 | | 10/1996 |
| EP | 0753603 | | 1/1997 |

* cited by examiner

*Primary Examiner*—Archene Turner
(74) *Attorney, Agent, or Firm*—Notaro & Michalos P.C.

(57) ABSTRACT

Disclosed are workpieces, especially those made of steel or hard metals, provided with at least two coatings of a wear-protective system, which qualities are improved even with high system thickness, so that adjoining coatings are realized with differing crystallographic privileged directions.

11 Claims, No Drawings

WORKPIECE WITH WEAR-PROTECTIVE COATING

The present invention relates to a workpiece, in particular tool, with wear-protective coating as well as a process for its manufacture.

To create a wear-protection system on workpieces, in particular on tools, in particular on steel and hard metal tools, it is known to apply hard material coatings, for example layers of TiN or TiCN onto the workpiece to protect. By hard metals are understood sintered carbides (cemented carbide). It is possible to increase the wear resistance, in particular the oxidation resistance, of said layers by adding aluminum. This is disclosed for example in JP-OS No. 4-53642/92 or 5-67705/93. It is further known to improve the properties of a wear-protective coating by forming a superlattice in connection with which reference is made, for example to JP-OS No. 7-97679/95.

The requirements made of the wear protection are increasing. Thus, for example, increasingly higher demands are made of tools with wear-protective coating in machining with respect to the attainable cutting speed in order to arrive thereby at higher throughputs or at greater efficiency.

In form working conventionally most often a soft steel was worked before the heat treatment. Today the form working is carried out only after the heat treatment, i.e. after the steel has been hardened.

In many cases, such as for example during high-speed machining, the oxidation resistance of the above mentioned coatings with aluminum addition is not satisfactory, for example for the machining working of hardened materials. This is the case even though, as mentioned, the addition of aluminum improves the properties in this regard, such as that of TiN or TiCN layers.

The stated wear-protective coatings are conventionally applied by vacuum coating processes, such as for example by ion plating or, if appropriate, also by CVD processes.

When applying these layers, such as for example through ion plating, the residual compressive stress increases proportionally to the thickness of the applied layer. Correspondingly to the increase of the residual compressive stress the adhesion, or the adhesion to be considered under the aspect of the shearing load, between layer and workpiece body, in particular comprising steel or hard metal, decreases such that layer thicknesses of maximally 5 $\mu$m can be used. Since precisely during ion plating relatively pronounced residual compressive stresses remain, it is also known that due to this process workpieces with wear-protective coating are inferior compared to workpieces coated by means of chemical vapor deposition processes (CVD) in that when the last denoted process is used, due to the stated residual compressive stresses, layer thicknesses of 5 to 15 $\mu$m can be used.

If the hardness of the layer is increased through forming a superlattice, this does increase the wear resistance, but simultaneously such a hard layer has a high Young's modulus and very high residual compressive stresses, which forces the thickness of such a layer to be restricted merely to 3 to 5 $\mu$m. The occurrence of said high residual compressive stresses when coating with superlattice structures leads, moreover, also to problems of adhesion between layer and workpiece body.

It is the task of the present invention to propose a workpiece, in particular comprising steel or a hard metal, with wear-protective coating and a process for its manufacture, on which occur significantly decreased residual compressive stresses. Thus, the workpiece with wear-protective coating is to comprise a wear protection layer system which, while simultaneously increasing the wear resistance, and thus decreasing the adhesion problems, can be realized to be substantially thicker than has previously been the case. This is solved through the workpiece with wear-protective coating which is distinguished according to the characterizing clause of claim 1 or by its manufacture according to claim 11.

It has accordingly been found that by providing a wear protection layer system with at least two successive layers, each with differing crystallographic privileged orientation, the posed task is solved. Thus, an increased layer thickness is realizable without the residual compressive stresses increasing correspondingly.

Preferred embodiments of the invention are described in the following.

A corresponding process operation of the coating process suitable for wear protection yields in each instance a crystallographic privileged orientation in the crystal growth, such as, for example and in particular in PVD processes, therein in particular with reactive processes, such as with cathodic arc vaporization and sputtering. A layer produced for example through arc vaporization in general comprises a privileged orientation in crystal growth so that the layer is formed with a columnar crystal structure. As a rule, a columnar crystal particle is formed as a monocrystal which has grown in a specific direction and has very few defect loci. The crystals are lined up continuously and thus form a layer with the residual compressive stresses, as mentioned, increasing proportionally to the thickness of the layer. The invention is based on the findings that if two successive layers are deposited with differing crystallographic privileged orientations, a multiplicity of lattice defect loci are introduced at the interface between the layers. If, for example and preferably, a layer with privileged orientation to the (111) plane comprising TiN and a layer with privileged orientation to the (200) plane comprising TiCN or a layer with privileged orientation to the (111) plane comprising TiAlCN are layered pairwise as two- or multilayer systems wherewith the layer interfaces are formed discontinuously and an epitaxial growth is prevented, the stated multiplicity of lattice defect loci is introduced at the layer interfaces. During the further layer growth, these lattice defects are oriented such that the residual compressive stress is decreased over the entire layer system. A residual compressive stress equalization zone between said layers is virtually formed. Thus the formation of a collectively thick layer or a layer system with low residual compressive stress becomes possible.

Said layers are therein preferably each produced of one of the following materials:

TiN, TiCN, TiAlN, TiAlCN, either of the same material or preferably of differing said materials.

A TiAlN layer with a privileged orientation to the (200) plane having a thickness of 0.5 $\mu$m has a residual compressive stress of 1.2 GPa while the residual compressive stress in a TiAlN layer having a thickness of 10 $\mu$m and identical orientation already exceeds 8 GPa and its adhesion is correspondingly worse. But if a 0.5 $\mu$m thick TiAlN layer with privileged orientation to the (200) plane and a 0.5 $\mu$m TiN layer with privileged orientation to the (111) plane are applied alternately for the formation of a wear protection layer system, and specifically multilayered, for example up to a thickness of 10 $\mu$m, surprisingly a remaining residual compressive stress of maximally 2 GPa results.

As is evident, in a preferred embodiment the differing privileged orientation is realized by using differing layer materials, with identical or differing control of a vacuum coating process. But it is entirely possible to deposit the layers with differing privileged orientation of one and the same layer material, however, by means of differing process control.

As layer material pairs are preferred:
TiN/TiN
TiN/TiCN
TiN/TiAlN
TiN/TiAlCN
TiCN/TiCN
TiCN/TiAlN
TiCN/TiAlCN
TiAlN/TiAlN
TiAlN/TiAlCN
TiAlCN/TiAlCN
and in each of the denoted combinations of preferably differing materials the one or the other layer can be applied as the first layer onto the workpiece.

Among the layer combinations with differing materials, preferred as stated, are especially preferred the combinations:
TiN/TiAlN
TiCN/TiAlCN
or, if appropriate,
TiN/TiAlCN
TiCN/TiAlN As coating processes are especially preferred reactive or non-reactive PVD processes, and in particular reactive processes, in particular cathodic arc vaporization and sputtering.

The workpieces, preferably comprising a steel or a hard metal, are preferably tools, therein in particular forming or press tools, in particular preferred indexable inserts, end-milling tools, in particular drills or milling cutters, further gear cutting tools and saw blades.

With the workpiece with wear-protective coating according to the invention, such as in particular the just described wear protection system of 10 μm and greater thickness, formed by multiple pairing it is also prevented, for example during machining application of a workpiece according to the invention implemented as a tool, that the cracks generated during the machining on the surface of the layer expand in the interfaces between the layers. The stress concentration occurring at the crack projection is reduced through the multiplicity of lattice defects on said interface which interface thus forms a pronounced resistance against the further conveyance of cracks. Should the cracks nevertheless become greater, they are not conveyed into the basic body but rather only extend along the interfaces between said layers so that notches on cutting edges are largely prevented.

If cracks could spread unchecked along the interfaces between the layers this would entail the danger that individual layers of the wear protection layer system could become detached which would also lead to an impairment of the wear resistance. But, it has been found in the case of all denoted layer material pairs and, in particular, in the case of the preferred ones, for example with the combination of TiN and TiAlN or of TiCN and TiAlCN that the cracks precisely cannot spread unchecked along the interfaces between the layers. The reason for this is, in principle, probably because, due to the differing privileged orientation according to the invention and thus the high density of discontinuities in the layer transition region, a spreading of the crack in this transition region is decisively prevented.

As a result it is found that a workpiece with wear-protective coating according to the invention, due to the layer system thickness provided, has a high wear resistance with the cracks hardly propagating through the wear protection layer system, i.e. the wear protection layer system has a high degree of toughness. Therewith, with the workpiece according to the invention, compared with workpieces with wear protection systems without privileged orientation change between the layers, not only an increased layer system thickness can be used but, with thin layer systems, compared to previously known systems, for example compared with tools with identical thickness of a uniform layer, a significantly extended service life is attained.

Definition

I(XXX) indicates the intensity of the (XXX) plane, measured by means of X-ray diffraction according to the θ-2θ method.

The value of the quotient I(200)/I(111) of one of the layers, for example comprising TiAlN or TiAlCN, is selected to be at least 1 since with higher (111) privileged orientation a higher residual compressive stress results on this layer, which is undesirable. But if this layer has a (200) privileged orientation, the residual compressive stress of the layer is kept low. For this reason, this layer requires a (200) privileged orientation by which means said quotient is preferably selected to be at least 1. This applies in particular to layers of one of the materials comprising Al.

To introduce lattice defects on the interface between the one layer and the other, the latter should have the reverse privileged orientation. Consequently, in the above described example the other layer, for example comprising TiN or TiCN, should have a (111) privileged orientation by which means preferably a quotient I(200)/I(111) should be maximally 1 at this layer, but, in any event, not be equal to the quotient for the first mentioned layer.

If the total thickness of the layer system is less than 1 μm, such a layer system has only a negligible wear protection effect. If, on the other hand, the total thickness of the layer system exceeds 15 μm, problems could arise with respect to adhesion on the basic steel body, wherewith the wear protection layer system preferably is at least 1 μm thick and preferably maximally 15 μm.

EXAMPLE 1

Hard metal indexable inserts according to JIS P40 and commercially available HSS shank-type milling cutters were coated by cathodic arc vaporization by means of Ti target and TiAl target (Ti/Al=50/50) and layer systems according to the invention were formed according to Table 1. In the comparison examples TiN or TiAlN layers were applied as monolayer systems according to the same process, namely cathodic arc vaporization.

The coated hard metal indexable inserts were tested under the Machining Conditions No. 1 reproduced below until the wear on the open space had reached 0.3 mm. The machining length was determined as the service life criterion.

The coated HSS shank milling cutters were tested according to the Machining Conditions No. 2, also described below, until the wear on the open space had reached 0.2 mm. The machining length was also determined as the service life criterion. The results are listed in Table 1.

Machining Conditions No. 1:
 For hard metal indexable inserts (SEE 42-TN)
  Material to be machined: X 40 CrMoV51 (DIN 1.2344), DAC(HRC40)

Cutting rate: 100 m/min
Advance: 0.1 mm/tooth
Cutting depth: 2 mm
Dry working
Machining Conditions No. 2:
  For HSS end-milling cutters
  Material to be machined: 40 CrMoV51 (DIN 1.2344), DAC(HRC10)
  Cutting rate: 50 m/min
  Advance: 0.07 mm/tooth
  Axial cutting depth: 18 mm
  Radial cutting depth: 6 mm
  Dry, cut-down milling which both materials of the adjacent layers are present, thus with adjoining layers of TiN and TiAlN layers these two stated materials, and, analogously, in the case of TiCN and TiAlCN layers, the corresponding two materials. Thereby the tendency of cracks spreading along the layer interfaces is even more effectively abated.

If the thickness of the transition layer is 5 nm or less, no effect against the cracks extending along the interfaces is attainable, and if it exceeds 500 nm, the layers tends to epitaxial growth, for example of the Ti nitride or—carbon nitride and TiAl nitride or—carbon nitride, respectively, so that the value $I(200)/I(111)$ is not readily controllable. The thickness of the transition layer is therefore limited to 5 nm up to 500 nm.

TABLE 1

| Sample No. | | Total thickness of layer (μm) | Number of layers | TiN I(200)/I(111) | TiAlN I(200)/I(111) | Service life of tool (m) | |
|---|---|---|---|---|---|---|---|
| | | | | | | Hard metal indexable inserts | HSS end-milling cutters |
| Inv | 1 | 8 | 16 | 0.5 | 1.5 | 5.7 | 48.8 |
| | 2 | 8 | 16 | 0.5 | 8.2 | 6.8 | 52.1 |
| Expls. | 3 | 8 | 16 | 0.1 | 1.5 | 8.9 | 51.3 |
| | 4 | 8 | 16 | 0.1 | 8.2 | 12.5 | 46.2 |
| | 5 | 13 | 26 | 0.5 | 8.2 | 22.8 | 88.5 |
| | 6 | 5 | 10 | 0.5 | 6.3 | 4.2 | 32.3 |
| | 7 | 3 | 8 | 0.5 | 6.3 | 1.7 | 22.5 |
| | 8 | 10 | 20 | 0.1 | 10.2 | 7.8 | 55.5 |
| | 9 | 10 | 20 | 0.1 | 15.1 | 8.9 | 57.8 |
| | 10 | 10 | 40 | 0.1 | 15.1 | 11.2 | 58.2 |
| Comp. | 11 | 3 | 1(TiN) | 0.5 | — | 0.8 | 8.3 |
| | 12 | 10 | 1(TiN) | 0.5 | — | 0.5 (splitting off) | 1.5 (broken out) |
| Expls. | 13 | 3 | 1(TiAl)N | — | 10.2 | 1.5 | 21.2 |
| | 14 | 10 | 1(TiAl)N | — | 10.2 | 0.5 | 10.2 (broken out) |

As can be seen in the above Table 1, in the steel bodies with wear-protective coating in the form of said tools with a total wear protection layer system thickness of far more than 10 μm (Example 5 according to the invention), the residual compressive stress is contained such that no splitting off of the layer is generated and no notch formation occurs on the cutting edge, and this is accomplished over very long service lives, compared to the comparison examples with only monolayer wear protection layer systems.

In a further development of the invention, between the layers a transition layer of 5 nm to 500 nm was provided, in In the following Table 2 the results attained with this further development are shown in comparison to results with tools protected with monolayer wear protection, in which again the coating techniques and machining test conditions described in Example 1 were used.

The transition layer was created through simultaneous cathodic arc vaporization from the corresponding Ti targets or Ti—Al targets, respectively. As in the embodiment example 1, the layers were generated by reactive cathodic arc vaporization in a reactive gas atmosphere comprising nitrogen.

TABLE 2

| Sample No. | | Total thickness of layer (μm) | Number of layers | TiN I(200)/I(111) | Thickness of transition (nm) | TiAlN I(200)/I(111) | Service life of tool (m) | |
|---|---|---|---|---|---|---|---|---|
| | | | | | | | Hard metal indexable inserts | HSS end-milling cutters |
| Inv | 1 | 8 | 16 | 0.5 | 50 | 1.5 | 6.6 | 52.2 |
| | 2 | 8 | 16 | 0.5 | 50 | 8.2 | 8.6 | 60.1 |
| Expls. | 3 | 8 | 16 | 0.1 | 50 | 1.5 | 9.8 | 58.2 |
| | 4 | 8 | 16 | 0.1 | 50 | 8.2 | 15.8 | 48.8 |
| | 5 | 13 | 26 | 0.5 | 100 | 8.2 | 23.1 | 90.2 |

TABLE 2-continued

| Sample No. | | Total thickness of layer (μm) | Number of layers | TiN I(200)/ I(111) | Thickness of transition (nm) | TiAlN I(200)/ I(111) | Service life of tool (m) | |
|---|---|---|---|---|---|---|---|---|
| | | | | | | | Hard metal indexable inserts | HSS end-milling cutters |
| | 6 | 5 | 10 | 0.5 | 100 | 6.3 | 4.0 | 33.5 |
| | 7 | 3 | 8 | 0.5 | 100 | 6.3 | 2.5 | 25.2 |
| | 8 | 10 | 20 | 0.1 | 50 | 10.2 | 9.2 | 56.0 |
| | 9 | 10 | 20 | 0.1 | 50 | 15.1 | 12.5 | 55.0 |
| | 10 | 10 | 40 | 0.1 | 50 | 15.1 | 15.1 | 56.0 |
| | 11 | 8 | 16 | 0.5 | 45 | 5.5 | 6.5 | 55.0 |
| | 12 | 8 | 16 | 0.5 | 15 | 6.8 | 9.5 | 62.1 |
| | 13 | 8 | 16 | 0.5 | 100 | 12.5 | 15.1 | 75.1 |
| | 14 | 8 | 16 | 0.7 | 200 | 2.2 | 5.2 | 52.1 |
| | 15 | 8 | 16 | 0.7 | 400 | 1.3 | 4.3 | 42.1 |
| | 16 | 13 | 16 | 0.7 | 50 | 20.0 | 21.2 | 88.1 |
| Comp. | 17 | 3 | 1(TiN) | 0.5 | — | — | 0.8 | 8.3 |
| | 18 | 10 | 1(TiN) | 0.5 | — | — | 0.5 | 1.5 |
| Expls | | | | | | | (splitting off) | (broken out) |
| | 19 | 3 | 1(TiAl)N | — | — | 10.2 | 1.5 | 21.2 |
| | 20 | 10 | 1(TiAl)N | — | — | 10.2 | 0.5 | 10.2 (broken out) |
| | 21 | 3 | 1 (TiN) | 0.1 | — | — | 0.9 | 8.3 |
| | 22 | 8 | 1 (TiN) | 0.1 | — | — | 0.6 (split off) | split off after coating |
| | 23 | 3 | 1 (TiAl)N | — | — | 6.8 | 1.4 | 20.5 |
| | 24 | 8 | 1 (TiAl)N | — | — | 6.8 | 0.2 (split off) | 2.5 (split off) |

As can clearly be seen in Table 2, by providing the transition layer with a thickness between 5 and 500 nm, preferably between 10 nm and 400 nm, an even better service life is obtained.

On the workpiece according to the invention, thus, a wear protection layer system with increased layer thickness and service life can be provided, preferably applied through a reactive PVD process, if appropriate also a non-reactive PVD process, and as PVD processes are especially suitable, in particular cathodic arc vaporization and sputtering, carried out reactively as well as non-reactively. Essential on the workpiece according to the invention or its production processes is the realization of the differing privileged orientation on two successive layers with a transition layer, if appropriate, embedded between them. Therewith a workpiece with wear-protective coating is created whose wear protection layer system has a high degree of toughness and the total wear protection layer system thickness, starting from thin layer systems up to thick ones, can be selected and therewith, in any event, the service life of such workpieces and in particular tools, compared to equally thick workpieces with monolayer wear-protective coating can be substantially increased.

Reference is made to the fact that the priority documents, according to the Japanese Applications No. 8-252384, Sep. 3, 1996
No. 8-252385, Sep. 3, 1996 are intended to form an integrated component of this application.

What is claimed is:

1. A workpiece with a wear-protective coating, the wear-protective coating comprising:

a first hard material layer made of a material selected from the group consisting of TiN, TiCN, TiAlN, TiAlCN;

a second hard material layer made of a material selected from the group consisting of TiN, TiCN, TiAlN, TiAlCN;

the second hard material layer being either directly deposited on the first hard material layer or a transition layer being between the first and second hard material layers, the transition layer being made of the materials of the first and second hard material layers, and the transition layer having a thickness of 5 nm to 500 nm;

said first and second hard material layers having the same crystal structure, but different crystallographic privileged orientation, a value I(200)/I(111) between an intensity of the (111) plane, I(111) and an intensity of the (200) plane, I(200), of one of said first and second hard material layers being at most 1, said value of the other of said first and second hard material layers being at least 1, said values being different from each other.

2. The coating of claim 1, wherein the first and second hard material layers comprise different materials.

3. The coating of claim 2, wherein the materials of the first and second hard material layers are one of: TiN and TiAlN, or TiCN and TiAlCN, or TiN and TiAlCN, or TiCN and TiAlN, respective, in any order.

4. The coating of claim 1, wherein a thickness of a monolayer forming at least one of the first and second hard material layers is maximally 2 μm.

5. The coating of claim 1, wherein a total thickness of the wear-protective coating is at least 1 μm.

6. The coating of claim 5, wherein the total thickness is at most 15 μm.

7. The coating of claim 1, wherein more than two of the first and second hard material layers are provided in the wear-protective coating.

8. The coating of claim 1, wherein a basic body of the workpiece on which the coating is deposited, comprises steel or a hard metal.

9. The coating of claim 1, wherein the workpiece is one of:

a press tool, an indexable insert endmilling tool, a drill, a milling cutter, a gear cutting tool, or a saw blade.

10. The coating of claim 1, wherein the first and second hard material layers with differing crystallographic privileged orientation are hard materials deposited on the workpiece by means of a PVD process.

11. The coating of claim 10, wherein the PVD process is one of cathodic arc vaporization or sputtering.

* * * * *